United States Patent [19]

Fukasawa et al.

[11] Patent Number: 4,720,829
[45] Date of Patent: Jan. 19, 1988

[54] ERROR CONTROL ENCODING SYSTEM

[75] Inventors: Atsushi Fukasawa; Takuro Sato; Haruhiko Akiyama; Manabu Kawabe, all of Tokyo, Japan

[73] Assignee: Oki Electric Industry Co., Ltd., Tokyo, Japan

[21] Appl. No.: 848,112

[22] Filed: Apr. 4, 1986

[30] Foreign Application Priority Data

Apr. 9, 1985 [JP] Japan ................ 60-73537

[51] Int. Cl.$^4$ ............................................. G06F 11/10
[52] U.S. Cl. ............................................. 371/5; 371/2; 371/32
[58] Field of Search ............... 371/5, 35, 41, 32, 2

[56] References Cited

U.S. PATENT DOCUMENTS

| | | | |
|---|---|---|---|
| 3,449,716 | 6/1969 | Brothman et al. | 371/5 X |
| 3,496,549 | 2/1970 | Tong | 371/35 X |
| 3,506,961 | 4/1970 | Abramson et al. | 371/41 X |
| 3,534,264 | 10/1970 | Blasbalg et al. | 371/5 X |
| 3,646,518 | 2/1972 | Weinstein | 371/35 |
| 3,657,700 | 4/1972 | Lutzker | 371/41 X |
| 3,725,860 | 4/1973 | Kemper et al. | 371/5 X |
| 4,110,558 | 8/1978 | Kageyama et al. | 371/41 X |
| 4,270,205 | 5/1981 | DeShon | 371/5 X |

OTHER PUBLICATIONS

"Error Correcting Codes Entering Upon Extensive Use in Various Fields" by Tanaka, Nikkei Electronics, 1975, 12-15, pp. 48-52 (Partial Translation).
"Batch Throughput Efficiency of ADCCP/HDLC/SDLC Selective Reject Protocols" by Malcolmc, Easton, IEEE Trans. on Comm., vol. COM-28, No. 2, Feb. 1980, pp. 187-195.

Primary Examiner—Charles E. Atkinson
Attorney, Agent, or Firm—Wenderoth, Lind & Ponack

[57] ABSTRACT

An error control encoding method and a mobile data communication system using the method in a moving body communication system such as mobile telephone for effecting data communication through a fading channel dominated by a burst error, upon receiving data transmitted from the transmitting side on the receiving side, detects any error involved in said received data as a frame error rate involved in block data or a bit error rate in the block data and thereby changes the frame length in response to the detected error rates. The mobile data communication system employs the error control encoding method wherein a frame length employed in the transmitting part is changed in response to the extent of any involved error in the received data detected by the remote receiving part.

6 Claims, 16 Drawing Figures

RECEIVING SIDE

TRANSMITTING SIDE

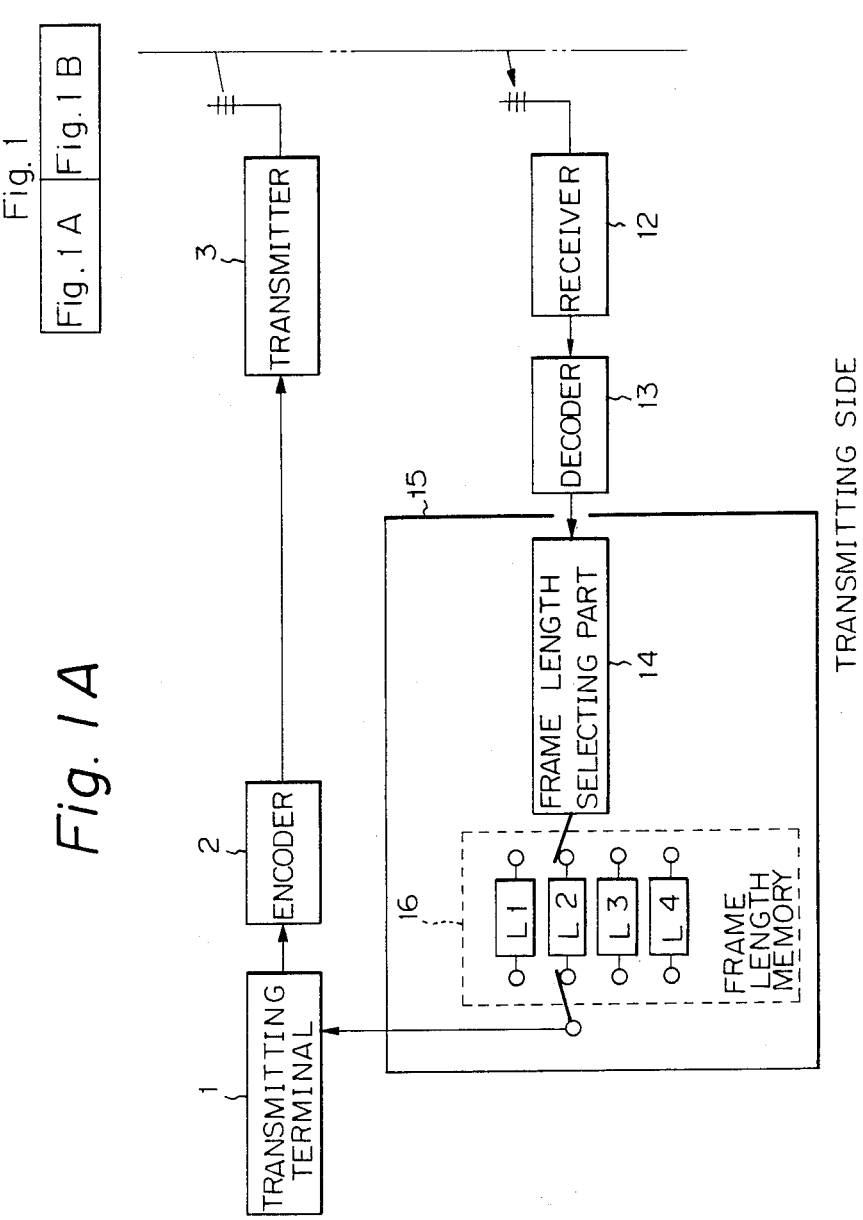

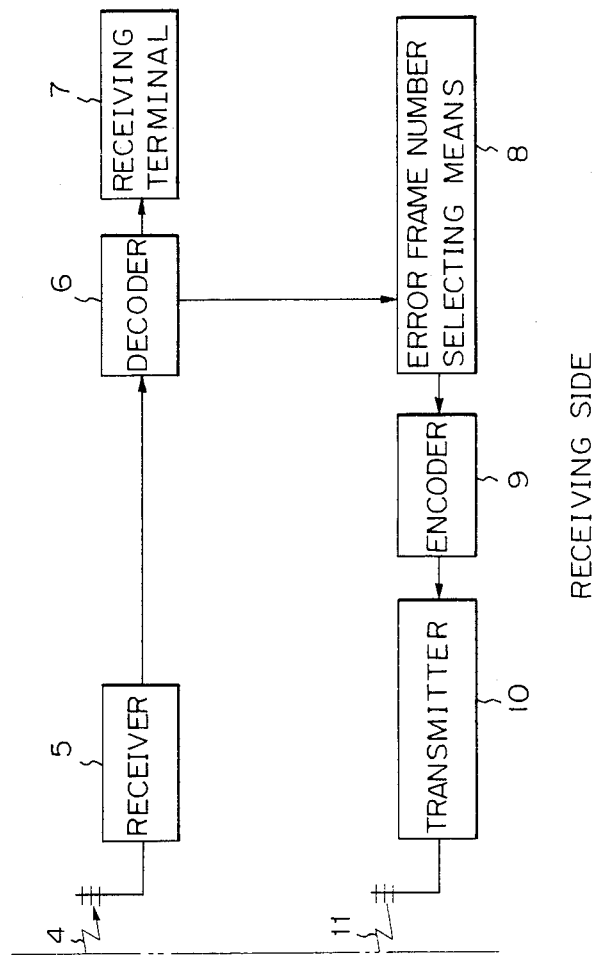

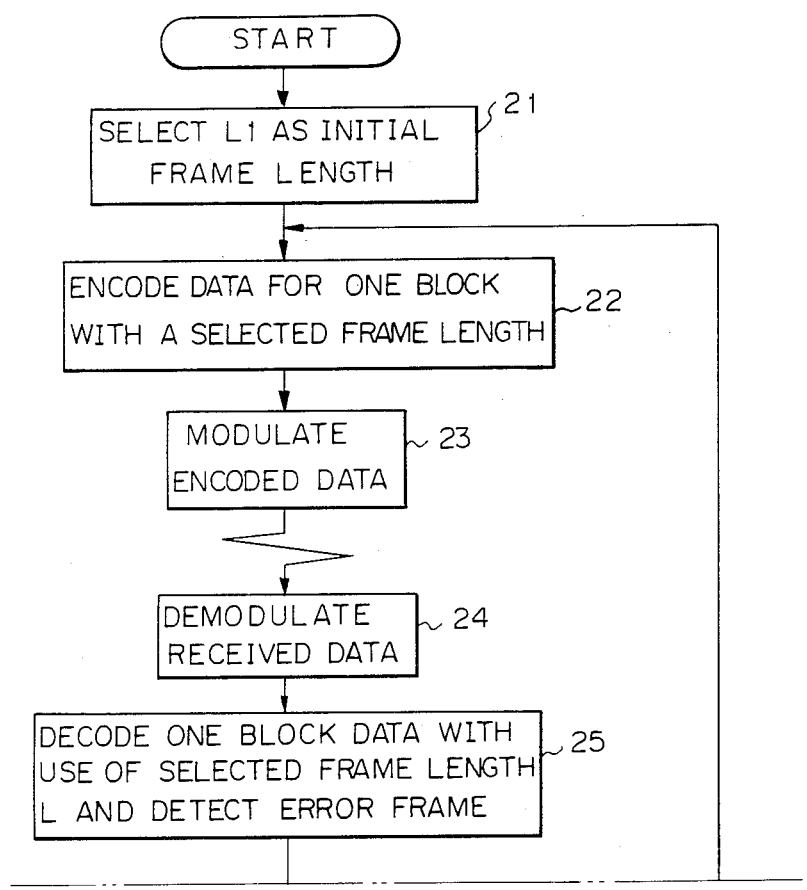

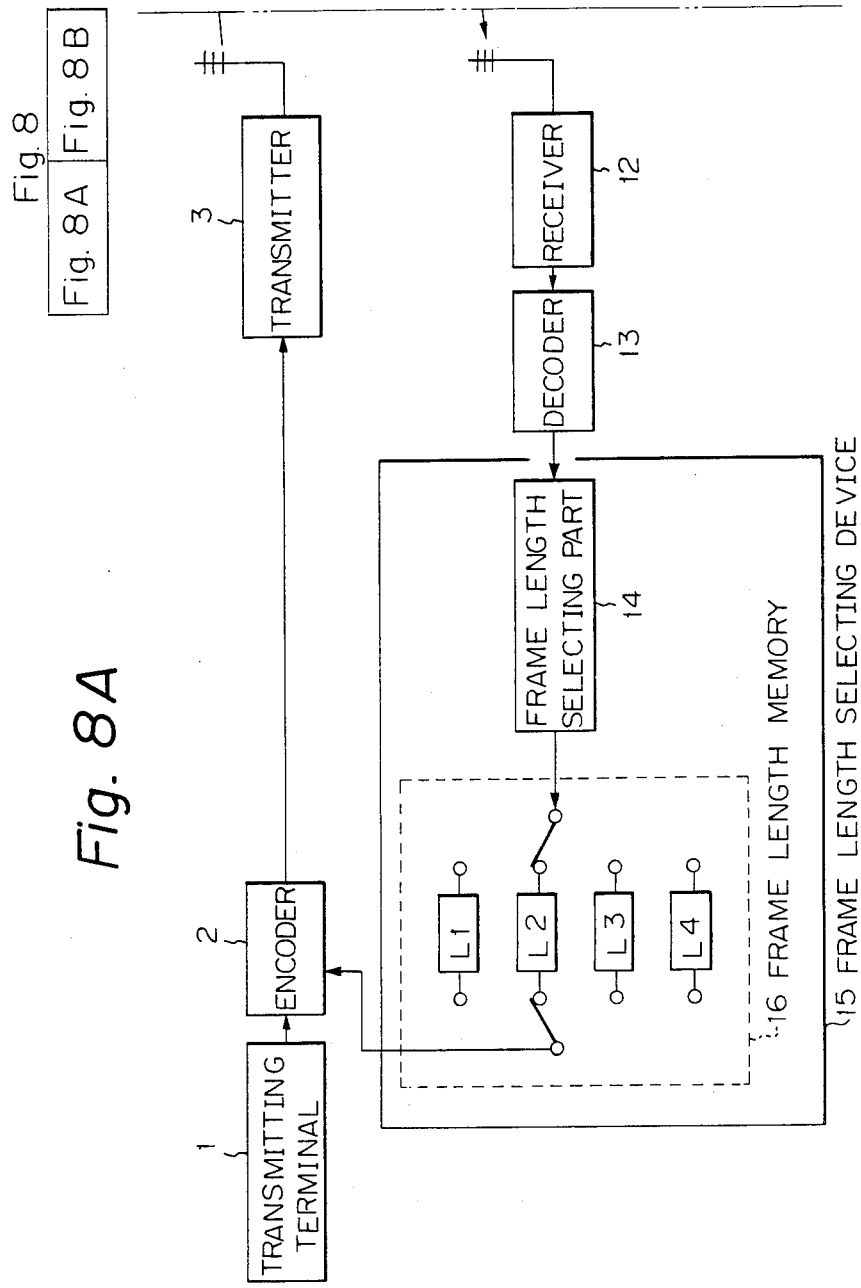

ERROR CONTROL ENCODING SYSTEM

BACKGROUND OF THE INVENTION

1. Field of the Invention

The present invention relates to an error control encoding system in effecting data communication via a fading channel dominated by a burst error in the data communication of a moving body such as an automobile.

2. Description of the Prior Art

Error correcting codes for automatically correcting digital information are essential to improve the reliability of contemporary computer communication systems. Error correcting codes are divided into, depending on correctable error patterns, an error correcting code suited to random errors and an error correcting code suited to burst errors.

In a mobile communication system, a severely degraded transmission path, such as a fading channel, is dominated by a burst error. An interleaving system is a known system used to correct the burst error, and is described in: "Error correcting Codes Entering upon Extensive Use in Various Fields" by Tanaka, Nikkei Electronics, 1975 12-15, p.p. 48 to 52. This employs powerful random error correcting codes for a communication channel dominated by a burst error, interleaves the codes with the digital information, and transforms a burst error to a random error.

However, the interleaving system encounters difficulties with a system having a severe delay time since it takes longer for decoding the data due to the interleaving.

In addition, another error correcting system, known as an automatic repeat request system (ARQ), is described in "Batch Throughput Efficiency of ADCCP/HDLC/SDLC Selective Reject Protocols" by Malcolm C. Easton, IEEE Transactions on Communications, Vol. Com: 28, February, 1980, p.p. 187 to 195.

These systems however needs several hundreds of bits of interleaving for randomizing the signal concerned with the aid of the interleaving since an automobile widely changes its moving speed from zero to a speed of one hundred and several tens of kilometers per hour as well as its receiving level from above minus 100 dBm to about minus several tens of dBm, and results in undesirably long delay times. Thus, a large capacity random access memory (RAM) is required together with a measure for improving the throughput efficiency which has been deteriorated. The deteriorated throughput efficiency is very severe in communication systems using only a burst length error correcting code.

SUMMARY OF THE INVENTION

In view of the drawbacks with the prior art error control encoding system, it is an object of the present invention to provide an error control encoding system whose throughput efficiency is not significantly changed in a mobile communication system even if the moving body containing the system changes its moving speed from zero to one hundred and several tens of kilometers per hour or changes its receiving level from a lower value to several tens of dBs. The error control encoding system according to the present invention is adapted to detect any error involved in received data as a frame error rate in a data block or a bit error rate in a data block when the receiving side receives the data transmitted from the transmitting side, and selecting a frame length in response to the extent of the error rate for encoding and decoding the transmission data.

An error correcting method according to the present invention in a mobile data communication monitors an error rate of data received on the receiving side and adaptively changes a frame length on the transmitting side based on a result of the monitoring, and comprises the steps of:

(1) transmitting transmission data encoded with use of a designated frame length to a communication channel;

(2) decoding the data received through the communication channel and thereby detecting error information involved in the received data;

(3) converting the error information to error data and returning it to the transmitting side;

(4) receiving the error information from the receiving partner for analysis and selecting an adaptive frame length in response to the analyzed result, and (5) framing erroneous data with use of the selected frame length for retransmission while designating the frame length as a frame length for use in step (1).

For the error information in this method, there are instances where the number of error frames (i.e., frame error rate) involved in a data block received and a bit error rate in one-block data received are profitably employed.

In addition, a mobile data communication device according to the present invention consists of: in a transmitting part:

(1) a frame length memory for storing a plurality of kinds of frame lengths;

(2) a receiver for receiving error information involved in received data transmitted from a remote receiving part;

(3) a decoder for decoding an output from the receiver;

(4) a frame length selecting means for selecting an adaptive frame length from the frame length memory in conformance with error information being an output from the decoder;

(5) an encoder for encoding data delivered from a transmitting terminal using the frame length selected by the frame length selecting means, and (6) a transmitter for transmitting the encoded data to a communication channel;

and in a receiving part:

(1) a receiver for receiving data transmitted from a remote transmitting part;

(2) a decoder for decoding an output from the receiver, and delivering it to a receiving terminal while detecting any error involved in the received data;

(3) a means for converting error infromation to error data;

(4) an encoder for encoding said error information converted to a suitable data format, and (5) a transmitter for transmitting an output from the encoder to the remote transmitting part.

The above and other objects, features and advantages of the present invention will be become more apparent from the following description when taken in conjunction with the accompanying drawings in which it preferred embodiment of the present invention is shown by way of illustrative example.

BRIEF DESCRIPTION OF THE DRAWING

FIG. 1, consisting of FIGS. 1A and 1B, is block diagram illustrating a first embodiment of an error control encoding system according to the present invention;

DESCRIPTION OF THE PREFERRED EMBODIMENT

Figure 2B:
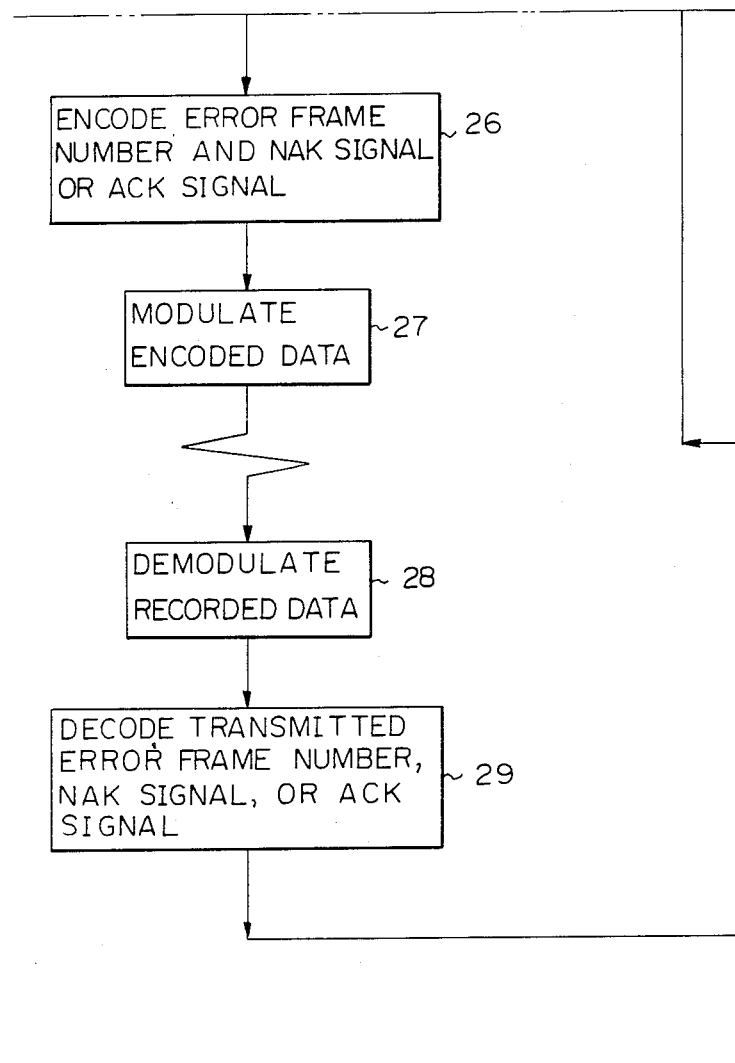
FIG. 2, consisting of FIGS. 2A-2C, is a flowchart illustrating the operation of the block diagram of FIG. 1.

A first embodiment of an error control encoding system according to the present invention will be described with reference to FIG. 1 and FIG. 2. According to this embodiment, a received error frame is detected on the receiving side and an ACK signal or an error frame number and an NAK signal are transmitted back to the transmitting side for each data block. A frame error rate for each data block is evaluated in the transmitting side and the frame length is altered in conformance with the evaluation for error frame retransmission and data transmission thereafter.

In FIG. 1, element 1 is a transmitting terminal; element 2 is an encoder; element 3 is a transmitter; element 4 is a communication channel; element 5 is a receiver; element 6 is a decoder; element 7 is a receiving terminal; element 8 is an error frame number selecting means; element 9 is an encoder; element 10 is a transmitter; element 11 is a communication channel; element 12 is a receiver; element 13 is a decoder; element 14 is a frame length selecting part; element 15 is in a frame length selecting device, and element 16 is a frame length memory.

The following is a description of the operation of the error control encoding system of FIG. 1. Four different lengths, L1, L2, L3, and L4 (for example, the frame length L1 is assumed to be twice L2, L2 twice L3, and L3 twice L4) are employed as frame lengths in the encoder 2, and the data concerned is assumed to be encoded with the frame length L1 as initial setting.

Figure 2C:
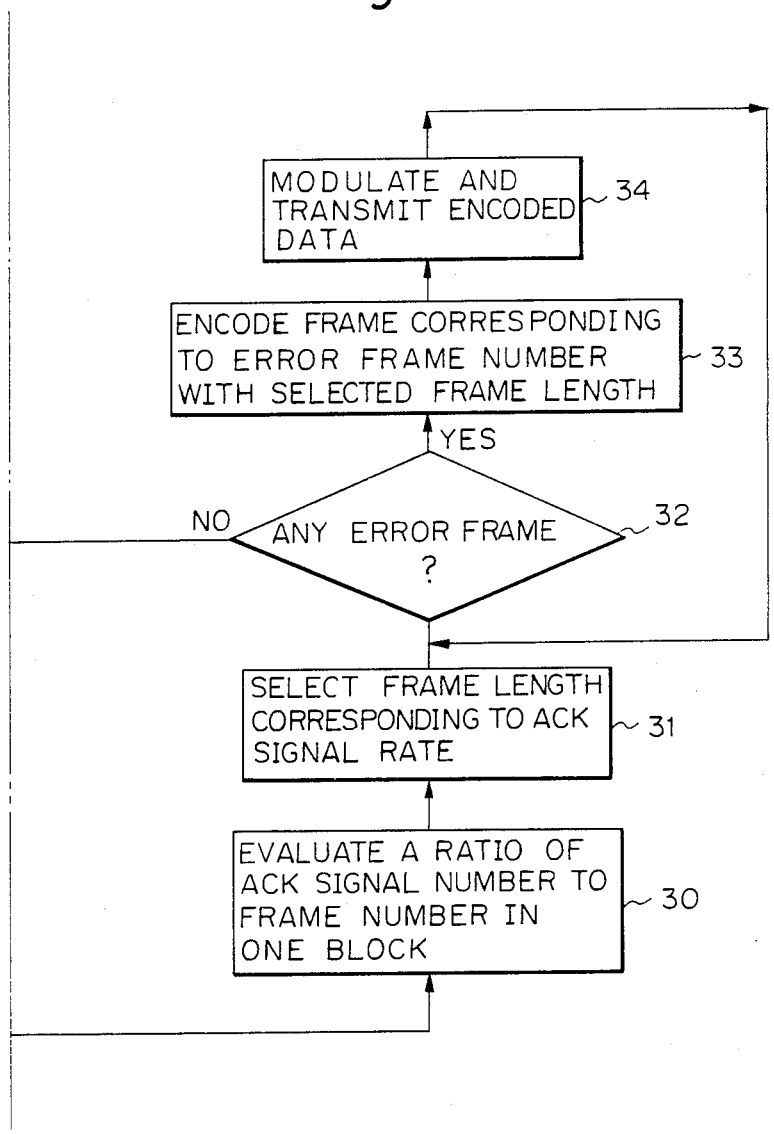

The encoder 2 encodes the data with an error detecting code (for example, a cyclic code), frames it with the frame length L1, numbers each frame, and blocks it with a prescribed frame number (FIG. 2, box 22).

The encoded data is modulated through the transmitter 3 and transmitted to the communication channel 4 (FIG. 2, box 23). The communication channel 4 is a fading channel which produces a burst error on the modulated signal as the moving body containing the system travels and the modulated signal with the burst error is received by the receiving side. The receiving side demodulates the received signal through the receiver 5 (FIG. 2, box 24). Subsequently, the decoder 6 decodes the demodulated signal using the error correcting code or the error detecting code for detecting an erroneous frame, and data obtained from frames without any error are supplied to the receiving terminal 7 (FIG. 2, box 25).

The error frame number selecting means 8 supplies the erroneous frame number and the NAK signal to the encoder 9 for a block decoded by the decoder 6. The frame number is yielded by a counter (not shown) serving to count the frame number involved in one block. Moreover, the error frame number selecting means supplies an ACK signal to the encoder 9 for the correct frames. The encoder 9 encodes the frame number and NAK signal or ACK signal using a code having a powerful error correcting capability such as a majority logic code, and delivers them to the communication channel 11 via the transmitter 10 (FIG. 2, boxes 26, 27).

The error frame number and the NAK signal or the ACK signal are sent to a frame length selecting part of the frame length selecting device 15 for each frame via the receiver 12 and the decoder 13 in conformity with an arbitrarily set time-out needed to permit the ACK-/NAK signal to be properly transmitted.

The frame length selecting part 14 receives the ACK signal and the NAK signal and selects a frame length based on their states. For example, with the ACK signal or the NAK signal received in the order of the arriving frames, the frame length selecting part 14 decides at that time that a longer frame length should be selected provided all the frames involved in one block are the ACK signal, and decides that a shorter frame length should be selected provided a rate of the ACK signal involved in all the frames is less than a predetermined value, and otherwise decides that the present frame length should be maintained. These procedures are repeated until no frame error is found (FIG. 2, boxes 30, 31, 32). The decided results serve as a signal for selecting one of the frame lengths L1, L2, L3, and L4 in the frame length memory 16. The selection is effected by allowing a controller (not shown) to receive the selection signal.

For example, assuming that data is first sent with the frame length L1, provided that a frame error rate is less than a predetermined value, the frame length is changed to the length L2 which is shorter than that of the length L1. The encoder 2, for which the frame length L2 in the frame length memory 16 is designated, effects data retransmission for a frame having the frame mumber supplied with the NAK signal, with a new frame length L2 (FIG. 2, boxes 33 and 34). Then, provided that the frame number indicative of the NAK signal is less than the number of frames constituting a block, new data is assigned to the remaining frames based on the frame length L2. Provided that data retransmission with a further shorter frame length is required in the case of the transmission with the frame length L2, a further shorter frame length L3 is selected.

Transmitted the ACK signal for all the frames from the receiving side to the transmitting side, the frame length selecting part 14 selects a longer frame length and delivers input data with its frame length. Details of the retransmission thereafter will be omitted here.

Figure 3:
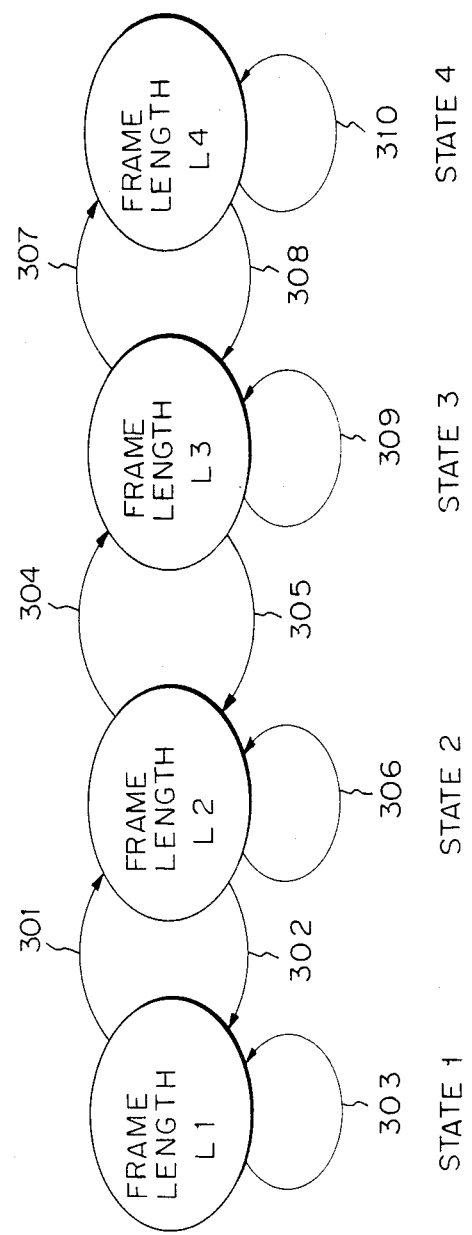
FIG. 3 is a view illustrating the transition among the steps of frame lengths from L1 to L4.

Referring then to FIG. 3, the following is a description of the transition among the steps of from the frame length L1 to L4. An initial state is started from a state 1. The state changes toward an arrow 301 based on information on the receiving side indicative of that a frame error rate in one block exceeds a predetermined value. Provided that it is less than the predetermined value, it keeps the same state in accordance with an arrow 303. Where the state changes from the state 1 to the state 2 and with degraded channel conditions, such that a frame error rate in one block exceeds a predetermined value, the state changes to a state 3 in accordance with an arrow 304. When the channel conditions get better and a frame error rate is less than a prescribed specific value, the state changes to the state 1 in accordance with arrow 302. When frame error rate ranges within a predetermined specific value, the state keeps the same state in accordance with an arrow 306. Transitions to states 3 and 4 are effected in a likewise fashion. It is also possible to encode data with an error correcting code on the receiving side for a frame length of each state. For instance, when the state is initiated from the state 1, the state changes to the state 2 in accordance with the arrow 301 based on information on the receiving side indicative of that a frame error rate in a block is evaluated from data yielded by decoding a predetermined error correcting code and it exceeds a predetermined specific value because all of the existent errors cannot to be corrected. Provided that all of the existent errors can be sufficiently corrected using the error correcting code, the state keeps the same state in accordance with the arrow 303. The state changes to the state 3 in accordance with the arrow 304 provided that the errors are incorrectable with the error correcting code in the state 2.

While, provided that the existent error can be sufficiently corrected with the error correcting code in the state 2 and the frame error rate is less than a predetermined specific value, the state changes to the original state 1 in accordance with the arrow 302. In addition, when the frame error rate lies within a predetermined specific value, the state keeps the same state in accordance with an arrow 306. Also for the states 3 and 4, the state changes in the same manner. Error correcting codes employed here may differ from each other in each state of FIG. 3. Namely, different error correcting codes may be selected and combined, for example, only an automatic repeat request system may be applicable in the state 1, a BCH (Bose, Chaudhuri, and Hocquenghem) code applicable in the state 2, and a majoring logic code in the state 4.

It can be easily understood that although the above description is for the automatic repeat request ARQ, it is applicable also for a block ARQ and a basic ARQ. The basic ARQ, if there is any NAK signal, retransmits all frames in a block and thus transmits back also a block number together with the NAK signal. In addition, although the transition from the i to i+1 or i−1 was described as shown in FIG. 3, transmitting from i to i+2 and i−2, and i+3 and i−3 are also possible depending on the channel conditions.

Figure 4:
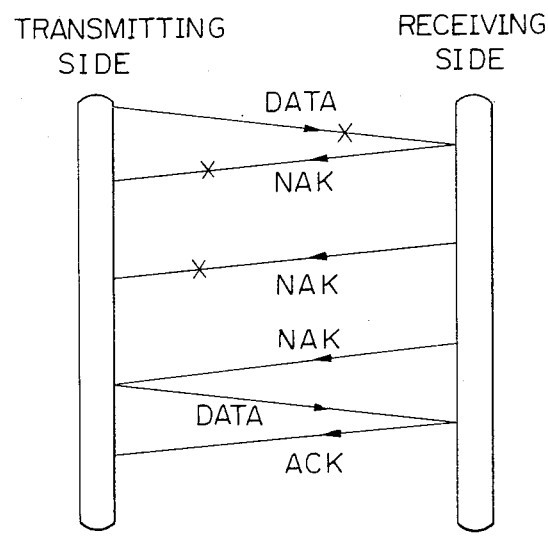
FIG. 4 is a view illustrating an exemplary transmission procedure with use of the embodiment of FIG. 1.

As shown in FIG. 4, which illustrates an example of a transmission procedure, the transmitting side adds an error correcting code to data, frames it with an initial setting frame length L2, and transmits it to the receiving side. The receiving side effects error detection and transmits back to the transmitting side the number of an erroneous frame together with a NAK signal after applying the error detecting code described above. With an error is produced here, the transmitting side sends no data to the receiving side, and so the receiving side again issues the same NAK signal.

Hereupon, although in the present embodiment the transmitting side is adapted to simply transmit data and the receiving side adapted to simply receive data so as to serve as effect a halfduplex transmission, it is evident that the present invention is applicable to full duplex systems since one terminal has both transmitting and receiving parts in general.

Figure 5:
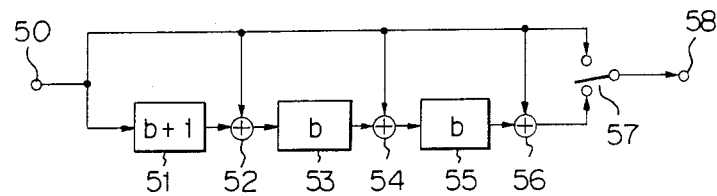
FIG. 5 is a block diagram illustrating the details of the encoder 2 shown in FIG. 1.

Referring to FIG. 5, an arrangement of an encoder 2 shown in FIG. 1 is illustrated, which operates with a diffusion code. The encoder, as is well known, consists of shift registers and exclusive ORs (mod 2). A circut in the encoder 2 is uniquely determined with a generator polynomial. Accordingly, the encoder 2, with the diffusion code described above, is arranged as shown in FIG. 5. As shown in FIG. 5, element 50 is an encoder input terminal; element 51 is a b+1 stage shift register; elements 53 and 55 are respectively b-stage shift registers; elements 52, 54, and 56 are respectively exclusive OR gates; element 57 is a switch for switching between an information mode and a check mode, and element 58 is an encoder output terminal. An information bit supplied to the encoder input terminal 50 is delivered on one hand to the information/check mode switching switch 57, and on the other hand to an input of the b+1 stage shift regester 51. The information bit, thereafter, is delayed through the exclusive ORs and b-stage shift registers, and a check bit is finally delivered from an output of the exclusive OR 56. These information and check bits are alternately supplied to the encoder output terminal 58 through operation of the information/check switching switch 57, and furthermore delivered to the transmitter 3.

Figure 6:
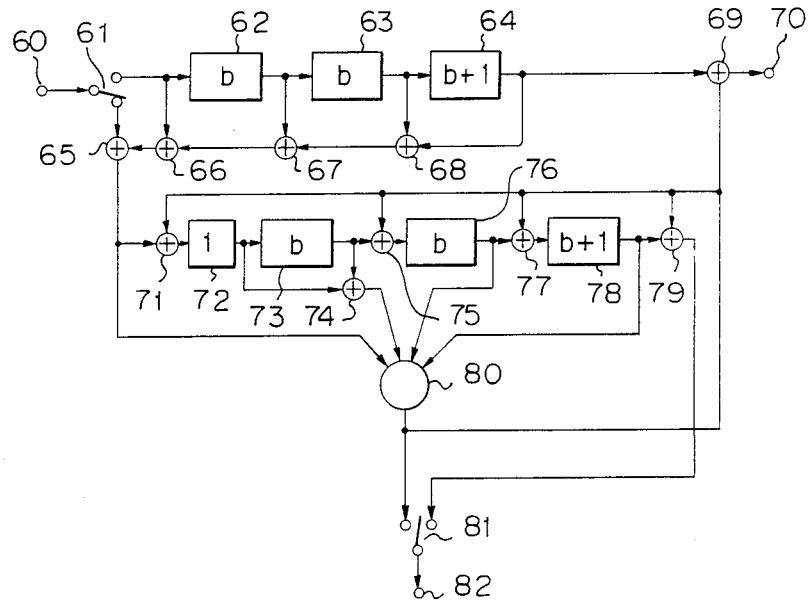
FIG. 6 is a block diagram illustrating the details of the decoder 6 shown in FIG. 1.

Moreover, the decoder 6 of FIG. 1 comprises a circuit of FIG. 6. The decoder 6 of FIG. 6 employs the diffusion code and decodes any data with a majority logic of a convolution code. As shown in the figure, elements 62 and 63 are b-stage shift registers; element 64 is a b+1 stage shift register, and elements 65, 66, 67, 68 and 69 are respectively exclusive OR gates. An information bit is supplied to the b-stage shift register 62 through switch 61 for alternately switching between information and check bits, and delayed via the b-stage shift register 64. In addition, a check bit is supplied from an output of the exclusive OR 66, the check bit being based on the received information bit. The check bit is operated upon by a check bit supplied via the information/check switching switch 61 by an exclusive OR 65. An output from the exclusive OR 65 is supplied on one hand to the exclusive OR 71 and error-detected through the exclusive ORs 71, 74, 77, and 79, the single-stage shift register 71, the b-stage shift registers 73 and 76, the b+1 stage shift register 78, and the majority element 80. As a result, the output of the majority element 80 provides an error detecting signal for the information bit while the output of the exclusive OR 79 provides that for the check bit. In addition, an output from the majority element 80 is supplied on one hand to the exclusive OR 69 for effecting erro correction for the information bit supplied from the b+1 stage shift register 64, and a data output signal is delivered to the receiving ternimal 8 via the data output terminal 70 of the decoder, the output from the majority element 80 is supplied on the other hand to an information/check switching switch 81. Moreover, an output from the exclusive OR 79 is supplied to the information/check switching switch 81 which alternately switches between the error detection signal for the information bit and that for the check bit and outputs one of them. As a result, the error detection signal is delivered to the error frame number selecting means 8 via the error detection signal output terminal 82.

Figure 7:
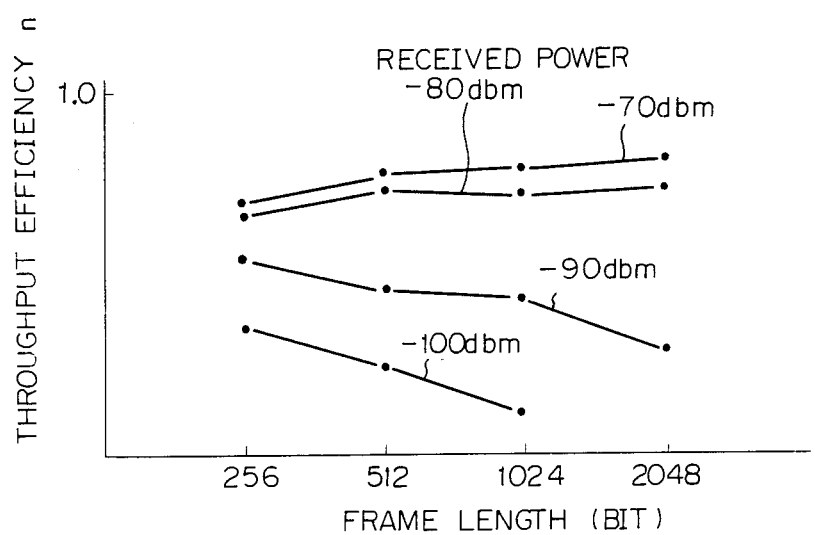
FIG. 7 is a view illustrating throughput efficiency in the embodiment of the present invention.

Referring the FIG. 7, which illustrates an effect of the present embodiment, the transmission efficiency of data is shown with respect to frame lengths with received powers being taken as a parameter when the moving body contains the system is travelling at 55 km/h and receives the data.

As shown in FIG. 7, with the received power being higher, the longer the frame length, the higher the transmission efficiency, while with the received powere being lower, the frame length must be reduced for raising the transmission efficiency. An error produced in the case is burst-natured and produced due to fading, etc. Consequently, when the moving body moves faster with the received power being reduced such that frequent burst errors are produced with a guard length being reduced, a reduced frame length enables a relatively high efficiency transmission to be achieved. When the moving body stops and performs data transmission, no burst error is produced to permit high efficiency transmission to be assured, provided that the frame length is increased.

Therefore, when the transmitting side receives more NAK signals than those under prescribed conditions, if the transmitting side retransmits the data concerned while leveling down a frame length previously prepared one step at a time, it can transmit the data with the optimum frame length in response to the conditions of a fading channel. Moreover, since the frame length is determined for each block, the present system can follow up abrupt changes of the conditions of the fading channel. Futhermore, when the number of frames received with any NAK signal and needed to be retransmitted is more than half the number of frames transmitted, the data transmission can be more effectively achieved provided that the data is retransmitted with a frame length leveled down by two steps from a previously prepared frame length.

A second embodiment of an error control encoding system according to the present invention will be described with reference to FIG. 8. Although the first embodiment described above was adapted to change a frame length based on an error frame rate involved in a block, the present second embodiment estimates a bit error rate of received data for each frame by comparing the estimated value with a specified transmission quality, i.e., a channel error rate, and thereby decides whether or not the frame concerned is an erroneous one for each frame and changes frame length based on a rate of the number of the resultant error frames involved in a block.

Figure 8B:
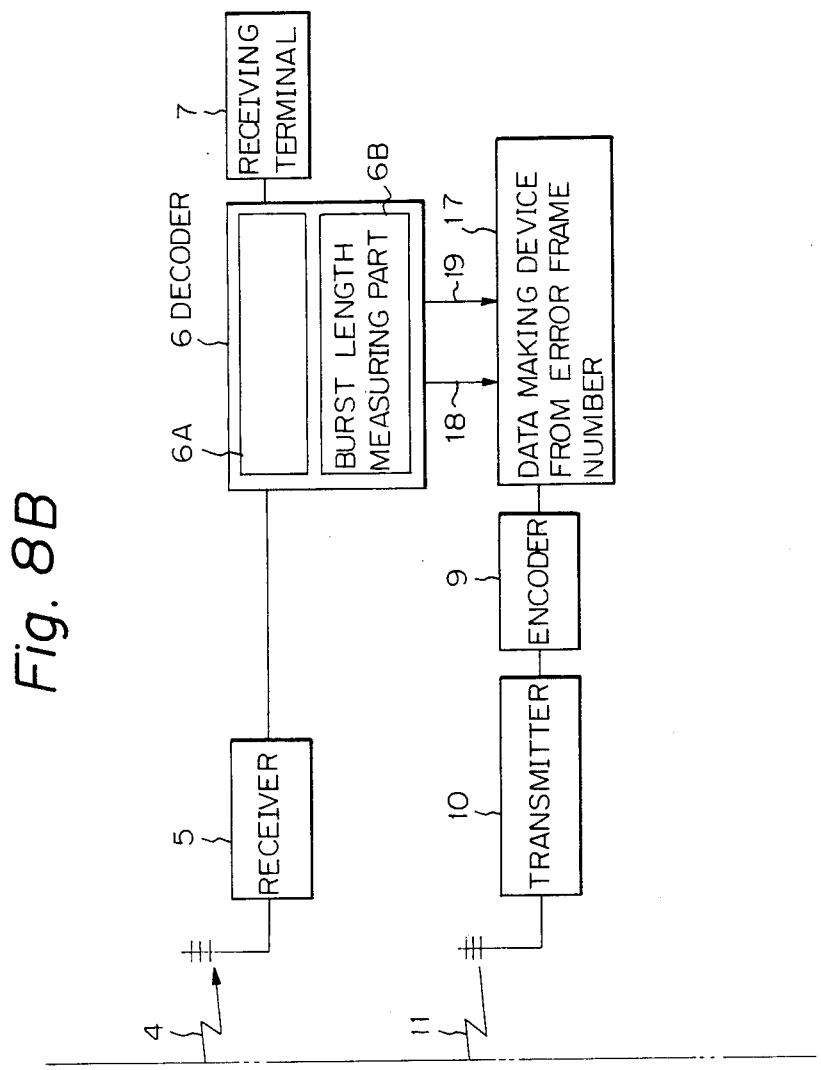
FIG. 8, consisting of FIGS. 8A and 8B, is a block diagram illustrating the arrangement of the error control encoding system according to the present invention.

As shown in FIG. 8, element 6 is a decoder; element 6A is a decoding part; element 6B is a burst length measuring part, and the other symbols are the same as those shown in FIG. 1. The transmitted data provided from the transmitting terminal 1 is delivered to the encoder 2. The encoder 2 encodes the data for a frame unit using the frame length L1, numbers them for each frame, and blocks a plurality of frames. (The present embodiment is assumed to employ a convolutional code as the error correcting code.)

The blocked encoded data is modulated through the transmitter 3 and provided to the communication channel 4. The frame length L1 is also delivered as data. In the receiving side, the received encoded data is demodulated through the receiver 5 and thereafter is decoded in the decoder 6. The decoding part 6A decodes the data using of a prescribed error correcting code or an error detecting code and sends normal data to the receiving terminal 7. Hereupon, the burst length measuring part 6B receives the error detecting signal delivered from the decoding part 6A and measures the length of a burst error and the length of an error-free interval for each frame for converting them into a channel bit error rate. Hereupon, when transmission quality is intended, for example, to be less than $10^{-6}$ in terms of the channel error rate, the burst length measuring part 6B decides that the measured frame is correct if its channel error rate is less than $10^{-6}$ and is incorrect if its error rate is more than $10^{-6}$.

Subsequently, a data-making device 17 converts the frame number decided to be erroneous to a data format suited to the present processing, and the encoder 9 encodes this data and provides it to the transmitter 10. The encoder 9 executed the encoding in conformity with a predetermined encoding system. The encoded data is modulated in the transmitter 10 and delivered to the communication channel 11.

The tranmitting side demodulates received modulated data through the receiver 12 and decodes the encoded data in the decoder 13 for detecting the error frame number. Although the decoded data is retransmitted from the receiving side to the transmitting side, the details thereof will be omitted here.

In succession, the frame length selecting part 14 evaluates a rate of the error frame number to the number of all of the frames previously transmitted and selects a frame length corresponding to this rate from the frame length memory 16. The selection of the frame is conducted in the same manner as that described in FIGS. 2 and 3. A frame corresponding to a frame number erroneously received by the receiving side is encoded with a selected frame length, modulated, and retransmitted to be receiving side via the transmitter 3. Thereupon, a newly selected frame length is also transmitted from the transmitting side to the receiving side. Hereby, the decoding part 6 of the receiving side can perform decoding corresponding to the frame length. After that, although the subsequent block data from the transmitting terminal 1 is transmitted with the newly selected frame length, the frame length is thereafter changed correspondingly to a frame error rate for each block.

Figure 9:
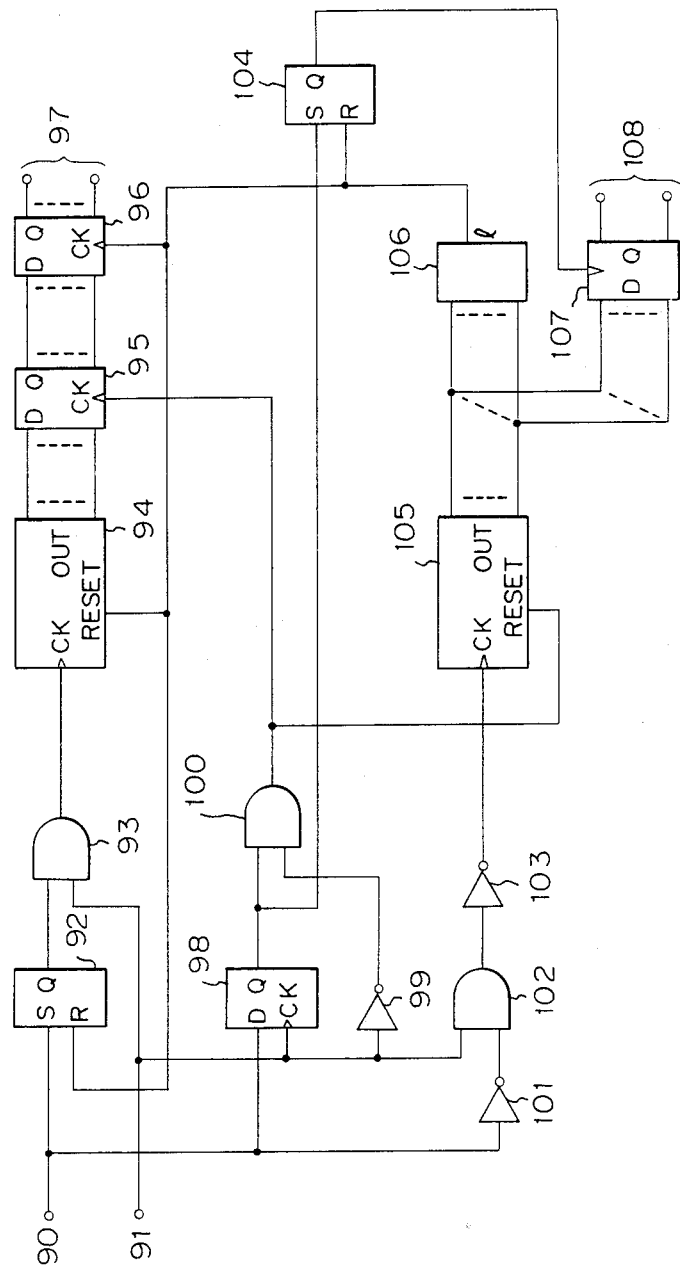
FIG. 9 is a block diagram illustrating the arrangement of a burst length measuring part 6B in the embodiment of FIG. 8.

Referring to FIG. 9, which illustrates the details of the burst length measuring part 6B which measures the length of a burst error and the length of an error free interval from an error detecting signal provided from the decoding part 6A.

As shown in FIG. 9, element 90 is an error detecting signal input terminal; element 91 is a receiving clock input terminal; elements 92 and 104 are respectively flip flops; elements 94 and 105 are respectively counters; elements 95, 96, 98, and 107 are respectively latches; element 97 is a burst error length output terminal; element 106 is a decoder; element 108 is an error-free interval length output terminal; elements 93, 100, 102 are respectively AND gates, and elements 99, 101, 103 are respectively inverters.

With a busrt error being existent on the communication channel 4, the flip-flop 92 is set by a first error of an error detecting signal supplied from the decoding part 6A via the error detecting signal terminal 90, and an output from the flip-flop is supplied to the counter via the AND gate 93. The value stored in the counter 94 is kept in the latch 95 every time any burst error is produced. On the other hand, when there is no burst error, a clock signal is provided to the counter 105 via the AND gate 102 and the inverter 103. The counter 105 counts the length of the state without any burst error. When the counted value by the counter 105 reaches a burst limit, this is detected by the decoder 106. As result, an output from the decoder 106 is provided to the clock input of the latch 96 and the burst error length is delivered from the latch 96. In addition, the output from the decoder 106 is supplied to the flip-flop 92 and a reset terminal (RESET) of the counter 94 to reset them. The length of the error-free interval in counting in the counter 105 is delivered from the latch 107 due to a signal provided via the latch 98 and the flip-flop 104 by a succeeding error. As a result, the burst error length and the error-free interval length are outputted respectively via the burst error length output terminal 97 and the error-free interval length output terminal 108 disposed in the burst length measuring part, and finally delivered to the outside via the burst length output terminal 18 and the error-free length output terminal 19 shown in FIG. 8.

Although certain preferred embodiments have been shown and described, it should be understood that many changes and modifications may be made therein without departing from the scope of the appended claims.

What is claimed is:

1. An error control encoding method in data communication for monitoring an error rate of received data and for thereby adaptively changing frame length for data transmission and reception, said error control encoding method comprising the steps of:
    (1) preparing a plurality of frame lengths, and selecting one of said lengths in accordance with initial state or an error rate of received data so that a high error rate causes a shorter frame length, said error rate being detected at a transmitting partner or a receiving partner;
    (2) encoding input data for each frame unit with redundancies and said selected lengths, and combining a plurality of frames together into a block with an information of said selected length and each frame number;
    (3) transmitting said encoded block data to said receiving partner;
    (4) decoding received data, and producing error information essentially involving error frame numbers and an error rate of received data;
    (5) returning said error information to said transmitting partner;
    (6) selecting one of said frame lengths in accordance with said error rate of said received data so that a high error rate causes a shorter frame length;
    (7) encoding input data of said error frame numbers for each frame unit with redundancies and said selected current length, and combining a plurality of frames together into a block with information of said current length and said error frame numbers, and
    (8) retransmitting said encoded block of error frames to said receiving partner.

2. An error control encoding system according to claim 1, wherein a bit error rate of the received block data is included in said error information, said bit error rate being compared with a prescribed channel error rate for an error decision of the received data, while a frame length is selected in response to said bit error rate for encoding.

3. An error control encoding system according to claim 1, wherein said error information includes a frame number and an NAK signal.

4. An error control encoding system according to claim 1, wherein said error information includes a block number, a frame number and the NAK signal.

5. A mobile data communication system employing an error control encoding method for changing frame length based on an error rate of the received data for data transmission and reception, said mobile data communication device comprising:
    in a transmitting partner:
    (1) a frame length memory for storing a plurality of frame lengths;
    (2) a receiver for receiving error information from a receiving partner;
    (3) a decoder for decoding an output from the receiver, and for detecting error frame numbers and an error rate;
    (4) a frame length selecting means for selecting one of said frame lengths from the frame length memory in accordance with an initial state or said error rate so that a high error rate causes a shorter frame length;
    (5) an encoder for encoding input data for each frame unit with redundancies and said selected length, and combining a plurality of frames together into a block with information of said selected length and each frame number, said input data being delivered from an input terminal or being said error frames present in a previous transmission;
    (6) a transmitter for transmitting said encoded block to said receiving partner, and
    in said receiving partner:
    (1) a receiver for receiving said block data from said transmitting partner;
    (2) a decoder for decoding an output from said receiver, and for detecting error frames;
    (3) a means for producing error information essentially involving numbers of said frames and an error rate of said received data, and
    (4) a transmitter for returning said error information to said transmitting partner.

6. A mobile data communication system according to claim 5, wherein in encoding the transmission data for each frame, and blocking a plurality of frames with a prescribed frame number for transmitting the blocked data to the communication channel,
    said encoded error correction codes comprise a plurality of different kinds of codes, each kind corresponding to a particular frame length.

* * * * *